(12) United States Patent
Nagasawa et al.

(10) Patent No.: US 8,742,758 B2
(45) Date of Patent: Jun. 3, 2014

(54) MAGNETIC RESONANCE IMAGING APPARATUS AND METHOD

(75) Inventors: Miho Nagasawa, Tokyo (JP); Yoshihiro Oda, Tokyo (JP); Antoine Choppin, Tokyo (JP); Takeshi Kubota, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 660 days.

(21) Appl. No.: 12/952,903

(22) Filed: Nov. 23, 2010

(65) Prior Publication Data

US 2011/0128001 A1    Jun. 2, 2011

(30) Foreign Application Priority Data

Nov. 27, 2009    (JP) .................................. 2009-269695

(51) Int. Cl.
*G01V 3/00*    (2006.01)
*G01R 33/44*    (2006.01)

(52) U.S. Cl.
USPC ............................. 324/318; 324/307; 324/309

(58) Field of Classification Search
USPC ............................ 324/300–322; 600/407–464
See application file for complete search history.

(56) References Cited

U.S. PATENT DOCUMENTS

| | | | |
|---|---|---|---|
| 6,377,044 B1 | 4/2002 | Burl et al. | |
| 6,500,122 B1 | 12/2002 | Washburn et al. | |
| 6,724,923 B2 | 4/2004 | Ma et al. | |
| 7,259,559 B2 | 8/2007 | Nabetani et al. | |
| 7,259,563 B2 | 8/2007 | Nozaki | |
| 7,639,008 B2 | 12/2009 | Ookawa | |
| 7,821,267 B2 * | 10/2010 | Yatsui et al. .................. | 324/318 |
| 7,960,972 B2 * | 6/2011 | Benschop ..................... | 324/309 |
| 8,433,390 B2 * | 4/2013 | Oda .............................. | 600/410 |
| 2005/0275402 A1 | 12/2005 | Campagna | |
| 2006/0152220 A1 * | 7/2006 | Nabetani et al. .............. | 324/309 |
| 2008/0211502 A1 * | 9/2008 | Arnold et al. ................. | 324/318 |

FOREIGN PATENT DOCUMENTS

| | | |
|---|---|---|
| EP | 1249708 A1 | 10/2002 |
| JP | 2006-175058 | 7/2006 |

* cited by examiner

*Primary Examiner* — Melissa Koval
*Assistant Examiner* — Emily Chan
(74) *Attorney, Agent, or Firm* — Armstrong Teasdale LLP

(57) ABSTRACT

A magnetic resonance imaging apparatus includes a plurality of coil elements for receiving magnetic resonance signals of a subject in a plurality of selectable combinations. The magnetic resonance imaging apparatus also includes a sensitive region storage device for storing respective sensitive regions for the combinations of the coil elements, a setting device for setting scan regions, a calculation device for calculating a scan volume rate indicating each of proportions of overlap regions between the scan regions and the sensitive regions to the scan regions, and a sensitivity volume rate indicating each of proportions of the overlap regions to the sensitive regions, and a selection device for selecting each combination of the coil elements used to receive the magnetic resonance signals of the subject, out of the combinations of the coil elements, based on the scan volume rate and the sensitivity volume rate.

19 Claims, 17 Drawing Sheets

FIG. 3

COMBINATIONS OF COIL ELEMENTS

Set1 = 4a + 4b
Set2 =           4c + 4d
Set3 =                     4e + 4f
Set4 =                               4g + 4h
Set5 = 4a + 4b + 4c + 4d
Set6 =           4c + 4d + 4e + 4f
Set7 =                     4e + 4f + 4g + 4h
Set8 = 4a + 4b + 4c + 4d + 4e + 4f
Set9 =           4c + 4d + 4e + 4f + 4g + 4h
   ⋮

Setn = 4a + 4b + 4c + 4d + 4e + 4f + 4g + 4h

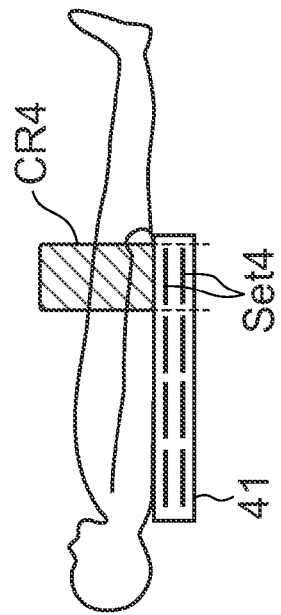
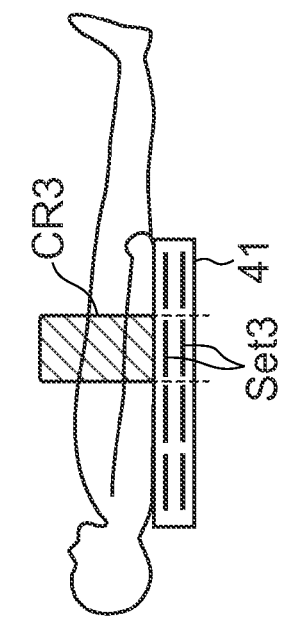

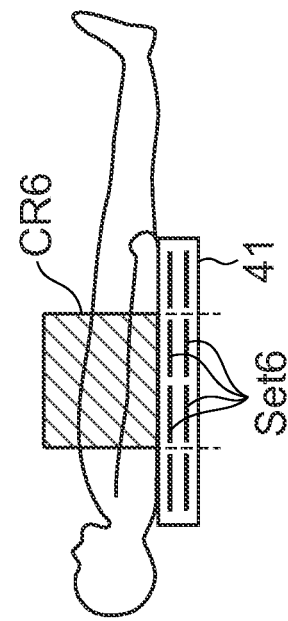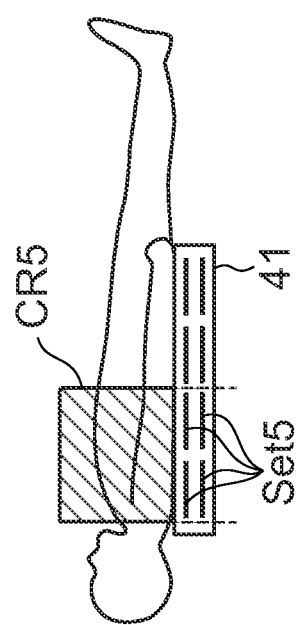

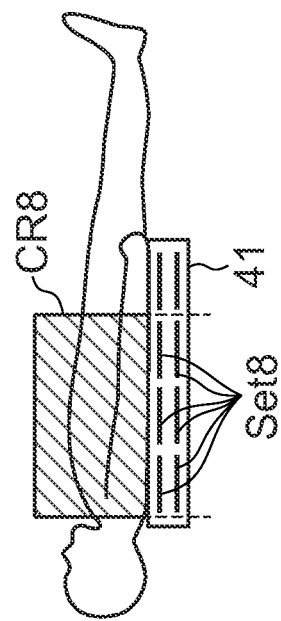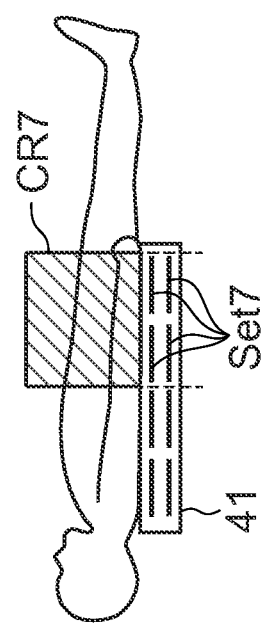

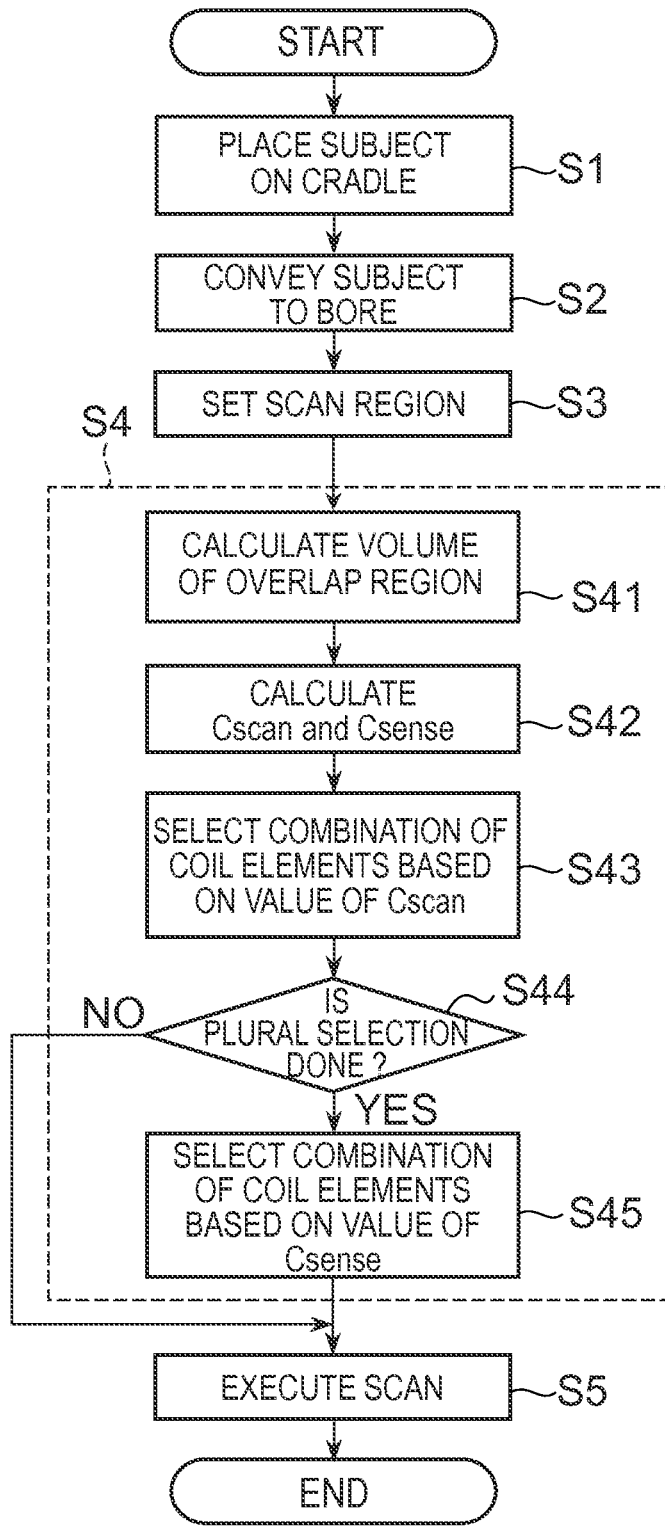

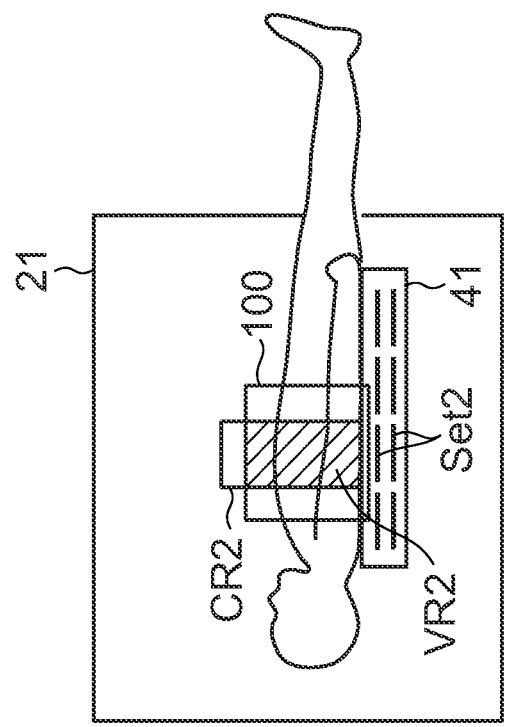
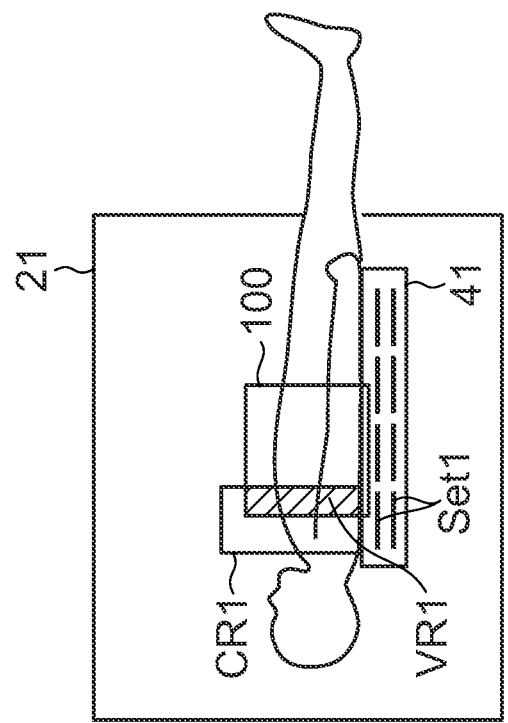

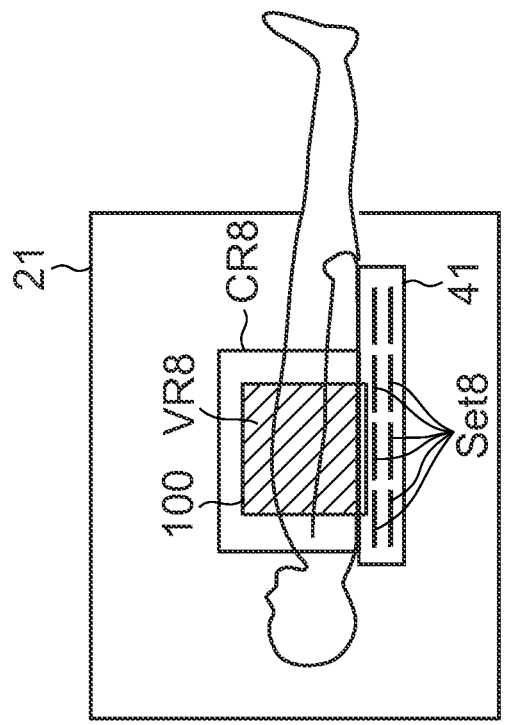
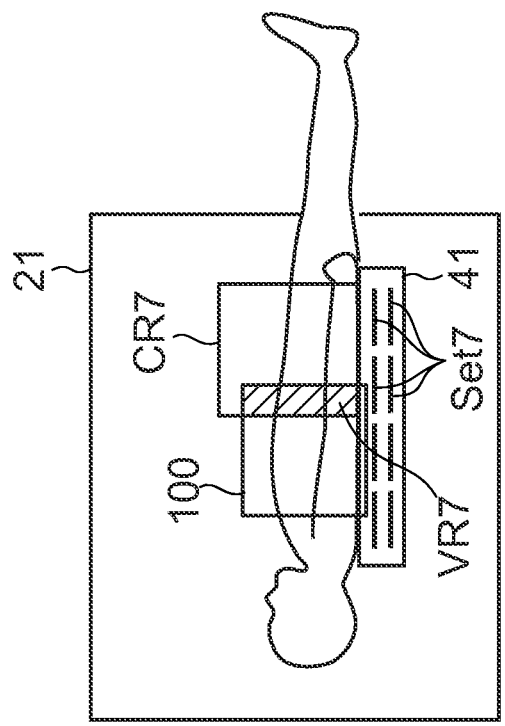

FIG. 17

| | OVERLAP REGION | VOLUME Vover |
|---|---|---|
| SCAN REGION 100 AND SENSITIVE REGION CR1 | V R 1 | v 1 |
| SCAN REGION 100 AND SENSITIVE REGION CR2 | V R 2 | v 2 |
| SCAN REGION 100 AND SENSITIVE REGION CR3 | V R 3 | v 3 |
| SCAN REGION 100 AND SENSITIVE REGION CR4 | — | — |
| SCAN REGION 100 AND SENSITIVE REGION CR5 | V R 5 | v 5 |
| SCAN REGION 100 AND SENSITIVE REGION CR6 | V R 6 | v 6 |
| SCAN REGION 100 AND SENSITIVE REGION CR7 | V R 7 | v 7 |
| SCAN REGION 100 AND SENSITIVE REGION CR8 | V R 8 | v 8 |
| SCAN REGION 100 AND SENSITIVE REGION CR9 | V R 9 | v 9 |
| ⋮ | ⋮ | ⋮ |
| SCAN REGION 100 AND SENSITIVE REGION CRn | V R n | v n |

FIG. 18

|  | SCAN VOLUME RANGE Cscan(%) | SENSITIVITY VOLUME RANGE Csense(%) |
|---|---|---|
| SCAN REGION 100 AND SENSITIVE REGION CR1 | 25 (%) | 40 (%) |
| SCAN REGION 100 AND SENSITIVE REGION CR2 | 50 (%) | 50 (%) |
| SCAN REGION 100 AND SENSITIVE REGION CR3 | 25 (%) | 40 (%) |
| SCAN REGION 100 AND SENSITIVE REGION CR4 | 0 (%) | 0 (%) |
| SCAN REGION 100 AND SENSITIVE REGION CR5 | 75 (%) | 60 (%) |
| SCAN REGION 100 AND SENSITIVE REGION CR6 | 75 (%) | 60 (%) |
| SCAN REGION 100 AND SENSITIVE REGION CR7 | 25 (%) | 20 (%) |
| SCAN REGION 100 AND SENSITIVE REGION CR8 | 90 (%) | 60 (%) |
| SCAN REGION 100 AND SENSITIVE REGION CR9 | 75 (%) | 40 (%) |
| ⋮ | ⋮ | ⋮ |
| SCAN REGION 100 AND SENSITIVE REGION CRn | 90 (%) | 40 (%) | ic RESONANCE IMAGING APPARATUS AND METHOD

CROSS REFERENCE TO RELATED APPLICATIONS

This application claims the benefit of Japanese Patent Application No. 2009-269695 filed Nov. 27, 2009, which is hereby incorporated by reference in its entirety.

BACKGROUND OF THE INVENTION

The present invention relates to a magnetic resonance imaging apparatus which selects coil elements used to receive magnetic resonance signals of a subject out of a plurality of coil elements.

As a coil for receiving each magnetic resonance signal, there has been known a Phased Array Coil. When a subject is imaged using the Phased Array Coil, an operator needs to select a combination of coil elements corresponding to an imaging portion of the subject out of the Phased Array Coil. As a technique for selecting a combination of coil elements by an operator, there has been known, for example, a technology described in Japanese Unexamined Patent Publication No. 2006-175058.

In the method, a scan for acquiring an image low in resolution is performed in advance, and the operator selects the corresponding combination of coil elements by reference to the low resolution image. The method is, however, accompanied by a problem that operations executed up to the selection of the combination of the coil elements become cumbersome.

It is desirable that the problem described previously is solved.

BRIEF DESCRIPTION OF THE INVENTION

A first aspect of the invention is a magnetic resonance imaging apparatus which includes a plurality of coil elements for receiving magnetic resonance signals of a subject and selects combinations of the coil elements used to receive the magnetic resonance signals of the subject out of the coil elements, the magnetic resonance imaging apparatus preparing a plurality of combinations of the coil elements selectable out of the coil elements, the magnetic resonance imaging apparatus including: a sensitive region storage device for storing respective sensitive regions for the combinations of the coil elements; a setting device for setting scan regions; a calculation device for calculating a scan volume rate indicating each of proportions of overlap regions between the scan regions and the sensitive regions to the scan regions, and a sensitivity volume rate indicating each of proportions of the overlap regions to the sensitive regions; and a selection device for selecting each combination of the coil elements used to receive the magnetic resonance signals of the subject, out of the combinations of the coil elements, based on the scan volume rate and the sensitivity volume rate.

In some embodiments, the corresponding combination of coil elements used to receive the magnetic resonance signals of the subject is selected out of the combinations of the plural coil elements, based on the scan volume rate and the sensitivity volume rate. It is thus possible to easily select the optimum combination of coil elements.

Further objects and advantages of the present invention will be apparent from the following description of the preferred embodiments of the invention as illustrated in the accompanying drawings.

BRIEF DESCRIPTION OF THE DRAWINGS

FIG. 3 is an explanatory diagram showing combinations Set1 through Setn of coil elements.

FIGS. 5A and 5B are diagrams for respectively explaining sensitive regions for the combinations Set3 and Set4 of the coil elements.

FIGS. 6A and 6B are diagrams for respectively explaining sensitive regions for the combinations Set5 and Set6 of the coil elements.

FIGS. 7A and 7B are diagrams for respectively explaining sensitive regions for the combinations Set7 and Set8 of the coil elements.

FIG. 9 is a diagram showing a processing flow of the MRI apparatus 1 when a subject is imaged.

FIGS. 12A and 12B are diagrams respectively showing overlap regions VR1 and VR2 between the sensitive regions CR1 and CR2 for the combinations Set1 and Set2 and a scan region 100.

FIGS. 15A and 15B are diagrams respectively showing overlap regions VR7 and VR8 between the sensitive regions CR7 and CR8 for the combinations Set7 and Set8 and the scan region 100.

FIG. 17 is a table showing volumes Vover of the overlap regions VR1 through VRn.

FIG. 18 is a diagram showing one example illustrative of values of a scan volume rate Cscan and a sensitivity volume rate Csense.

DETAILED DESCRIPTION OF THE INVENTION

Although one embodiment of the invention will hereinafter be explained, the invention is not limited to the following embodiment.

Figure 1:
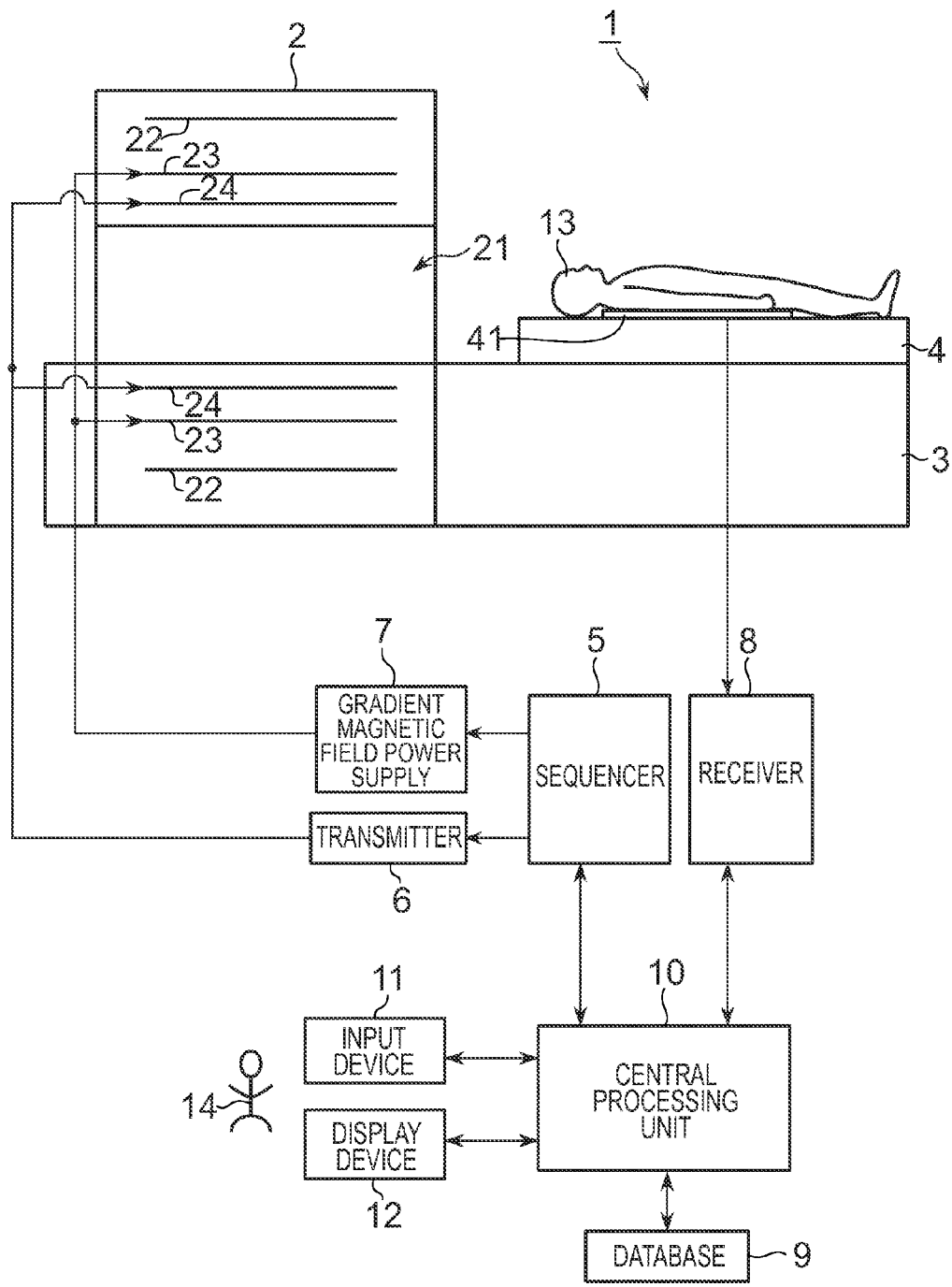
FIG. 1 shows a magnetic resonance imaging apparatus according to one embodiment of the invention.

FIG. 1 shows a magnetic resonance imaging apparatus according to one embodiment of the invention.

The magnetic resonance imaging apparatus (hereinafter called "MRI (Magnetic Resonance Imaging) apparatus") 1 has a magnetic field generator 2, a table 3, a cradle 4, a coil device 41, etc.

The magnetic field generator 2 has a bore 21 in which a subject 13 is accommodated, a superconductive coil 22, a gradient coil 23, and a transmitting coil 24. The superconductive coil 22 applies a static magnetic field B0 and the gradient coil 23 applies a gradient pulse. The transmitting coil 24 transmits an RF pulse.

The table 3 is equipped with the cradle 4 with the subject 13 placed thereon. The cradle 4 is moved into the bore 21 to thereby convey the subject 13 within the bore 21.

The coil device 41 is placed in a position determined in advance with respect to the cradle 4.

Figure 2:
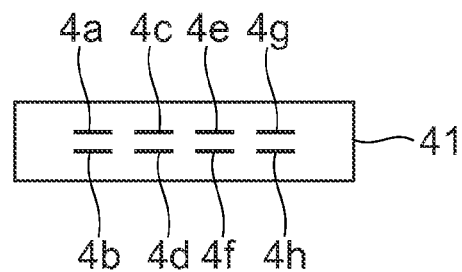
FIG. 2 is a side elevation of a coil device 41.

FIG. 2 is a side elevation of the coil device 41.

The coil device 41 has a plurality of coil elements 4a through 4h for receiving magnetic resonance signals of the subject 13. Although the eight coil elements are shown in FIG. 2 for convenience of explanation, the number of coil elements is not limited to eight, but may be changed as needed. Although the coil elements 4a through 4h are shown in FIG. 2 in a state of being placed so as to be arranged in two columns for convenience of explanation, the coil elements can be placed in arbitrary positions.

The MRI apparatus 1 further has a sequencer 5, a transmitter 6, a gradient magnetic field power supply 7, a receiver 8, a database 9, a central processing unit 10, an input device 11 and a display device 12.

Under the control of the central processing unit 10, the sequencer 5 transmits information about an RF pulse (center frequency, bandwidth and the like) to the transmitter 6 and sends information about a gradient magnetic field (strength of gradient magnetic field, etc.) to the gradient magnetic field power supply 7.

The transmitter 6 drives the transmitting coil 24, based on the information transmitted from the sequencer 5.

The gradient magnetic field power supply 7 drives the gradient coil 23, based on the information sent from the sequencer 5.

The receiver 8 signal-processes each magnetic resonance signal received by the coil device 41 and transmits it to the central processing unit 10.

The database 9 stores sensitive regions (refer to FIGS. 4 through 8) to be described later therein in conjunction with the cradle 4.

The central processing unit 10 generally controls the operations of respective parts of the MRI apparatus 1 so as to implement various operations of the MRI apparatus 1 such as reconstruction of an image based on each signal received from the receiver 8, etc. Further, the central processing unit 10 selects the coil elements used when the magnetic resonance signals of the subject 13 are received, out of the coil elements 4a through 4h, based on the sensitive regions stored in the database 9. The central processing unit 10 includes, for example, a computer. Incidentally, the central processing unit 10 is one example illustrative of a setting device, a calculation device and a selection device employed in the invention and functions as these means by executing a predetermined program.

The input device 11 inputs various instructions to the central processing unit 10 according to the operations of an operator 14. The display device 12 displays various information thereon.

The MRI apparatus 1 is configured as described above.

The coil elements 4a through 4h of the coil device 41 will next be described. In the present embodiment, when the magnetic resonance signals of the subject 13 are received, the combinations of the coil elements suited to receiving the magnetic resonance signals of the subject 13 are selected out of the eight coil elements 4a through 4h. In the present embodiment, n combinations Set1 through Setn of coil elements can be selected.

FIG. 3 is an explanatory diagram showing the combinations set1 through Setn of the coil elements.

FIG. 3 concretely shows some combinations of coil elements in the combinations Set1 through Setn. For instance, the combination Set1 of the coil elements includes the two coil elements 4a and 4b. Incidentally, the combinations of the coil elements are respectively comprised of two or more coil elements. In the invention, however, the combination of the coil element is the concept including even the case where it consists of one coil element. Thus, the combination of the coil elements may be comprised of, for example, only the coil element 4a.

The sensitive regions for the combinations Set1 through Setn of the coil elements will next be explained.

FIGS. 4A, 4B, 5A, 5B, 6A, 6B, 7A, 7B, 8A, and 8B are respectively diagrams for describing the sensitive regions for the combinations Set1 through Setn of the coil elements.

Figure 4A:
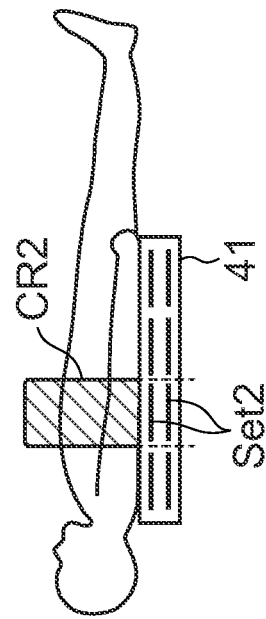
FIGS. 4A and 4B are diagrams for respectively explaining sensitive regions for the combinations Set1 and Set2 of the coil elements.
Figure 4B:
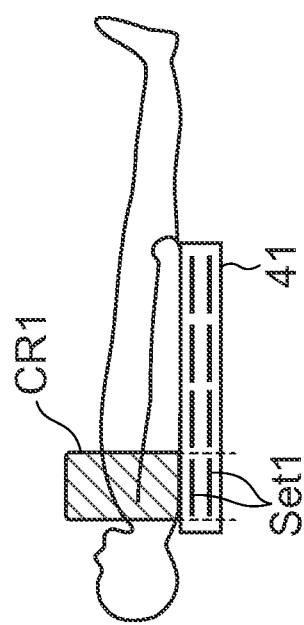
Figure 8B:
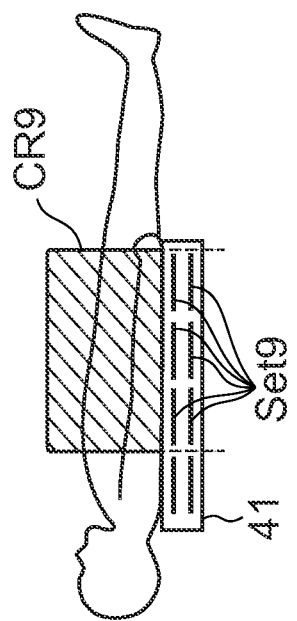
FIGS. 8A and 8B are diagrams for respectively explaining sensitive regions for the combinations Set9 and Setn of the coil elements.
Figure 8A:
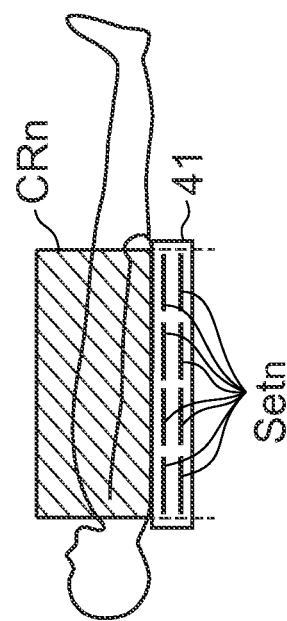

FIGS. 4A, 4B, 5A, 5B, 6A, 6B, 7A, 7B, 8A, and 8B respectively concretely show the sensitive regions of some of the combinations Set1 through Setn. The sensitive region CR1 for the combination Set1 is shown in FIG. 4A, for example. The sensitive region CR1 is a region considered to have sensitivity enough for the combination Set1 to obtain a high-quality MR image. As to the breadth of the sensitive region CR1, the sensitivity characteristic of the combination Set1 of the coil elements is examined in advance, and its breadth is determined based on the sensitivity characteristic thereof. Information (position information about the sensitive region CR1, volume of sensitive region CR1 or the like) about the sensitive region CR1 has been stored in the database 9.

While the sensitive region CR1 for the combination Set1 has been explained in the above description, the sensitive regions CR2 through CRn for other combinations Set2 through Setn are also similar to it.

The sensitive regions CR1 through CRn of the combinations Set1 through Setn have been defined as described above.

A flow used when the subject 13 is imaged will next be explained.

FIG. 9 is a diagram showing a processing flow of the MRI apparatus 1 when the subject 13 is imaged. Incidentally, when describing FIG. 9, it will be explained referring to FIGS. 10 through 18 as needed.

At Step S1, the operator 14 places the subject 13 on the cradle 4.

Figure 10:
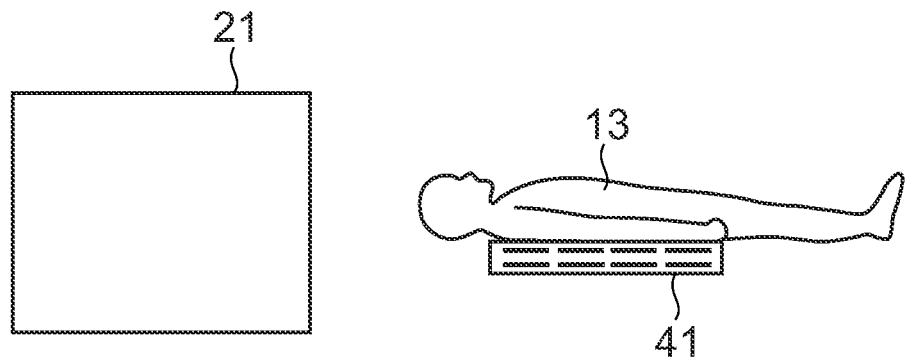
FIG. 10 is a diagram showing the manner in which a subject 13 is placed on a cradle 4.

In FIG. 10, the cradle 4 exists in a position farthest away from the bore 21 (hereinafter called "reference position").

In FIG. 10, the cradle 4 exists in a position farthest away from the bore (hereinafter called "reference position").

After the subject 13 has been placed on the cradle 4, the processing flow proceeds to Step S2.

At Step S2, the subject 13 is further conveyed within the bore 21.

Figure 11:
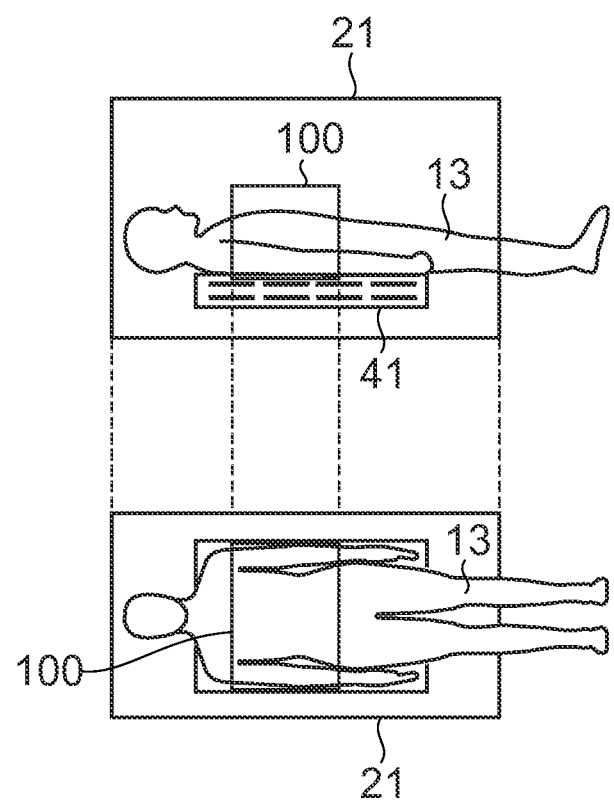
FIG. 11 is a diagram showing the manner in which the subject 13 is conveyed to a bore 21.

FIG. 11 is a diagram showing the manner in which the subject 13 is conveyed to the bore 21.

The upper stage of FIG. 11 is a diagram of the cradle 4 as seen from its side surface, and the lower stage thereof is a diagram of the cradle 4 as seen from its upper surface.

After the subject 13 has been conveyed to the bore 21, the processing flow proceeds to Step S3.

At Step S3, the operator 14 sets a slice position and a slice thickness or the like to thereby set a scan region 100 in which a scan is performed on the subject 13. After the scan region 100 has been set, the processing flow proceeds to Step S4.

At Step S4, the corresponding combination of coil elements used to receive the magnetic resonance signals is selected out of the n combinations Set1 through Setn of the coil elements. At Step S4, a description will be made below of how the combination of the coil elements is selected.

At Substep S41, the central processing unit 10 first calculates the volumes of portions (hereinafter referred to as "overlap regions") where the sensitive regions CR1 through CRn for the combinations Set1 through Setn of the coil elements and the scan region 100 overlap one another.

FIGS. 12A, 12B, 13A, 13B, 14A, 14B, 15A, 15B, 16A, and 16B are respectively diagrams showing the overlap regions VR1 through VRn between the sensitive regions CR1 through CR2 for the combinations Set1 through Setn and the scan region 100. Some (diagonally-shaded regions) of the overlap regions VR1 through VRn are concretely shown in FIGS. 12A, 12B, 13A, 13B, 14A, 14B, 15A, 15B, 16A, and 16B. The overlap region VR1 is shown in FIG. 12A by way of example.

FIG. 17 is a table showing volumes Vover of the overlap regions VR1 through VRn.

Figure 13B:
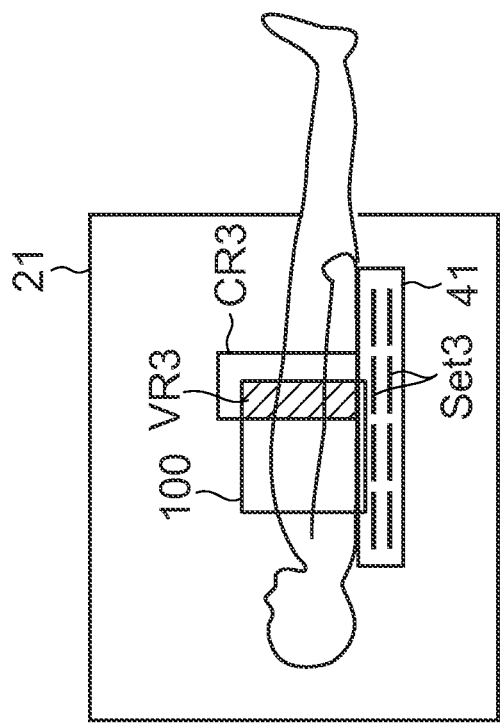
FIGS. 13A and 13B are diagrams respectively showing overlap regions VR3 and VR4 between the sensitive regions CR3 and CR4 for the combinations Set3 and Set4 and the scan region 100.
Figure 13A:
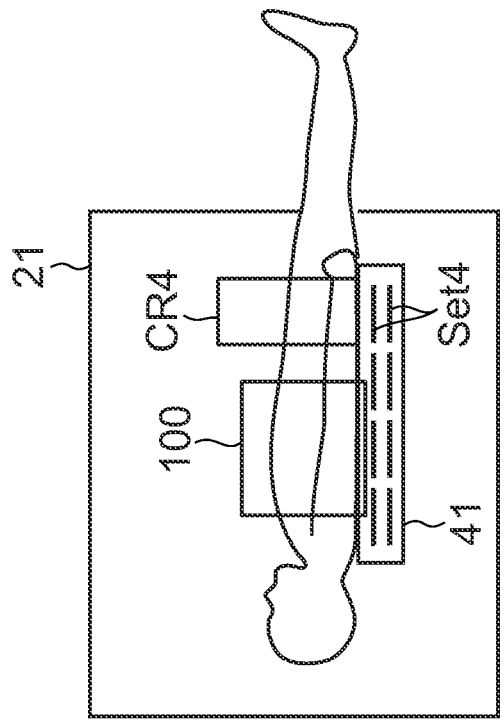
Figure 14A:
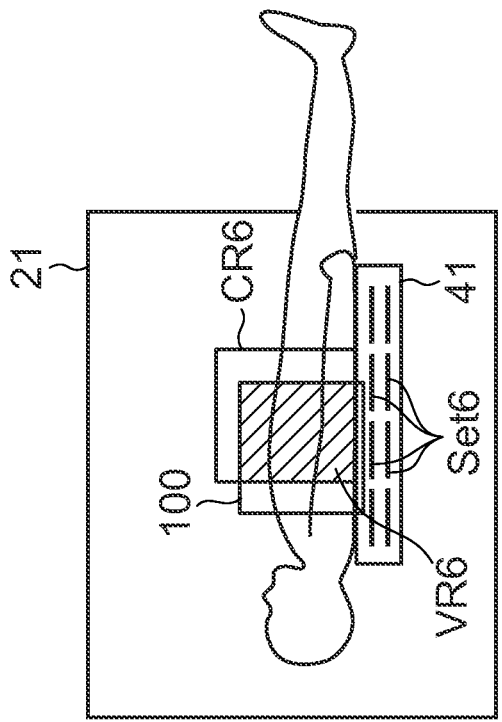
FIGS. 14A and 14B are diagrams respectively showing overlap regions VR5 and VR6 between the sensitive regions CR5 and CR6 for the combinations Set5 and Set6 and the scan region 100.
Figure 14B:
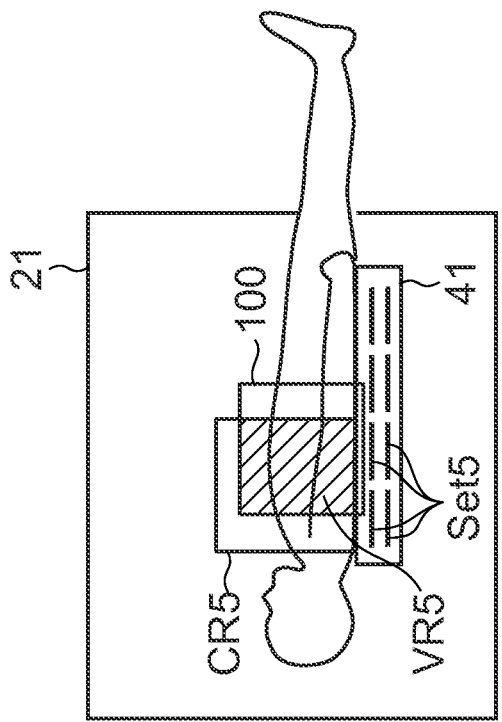
Figure 16A:
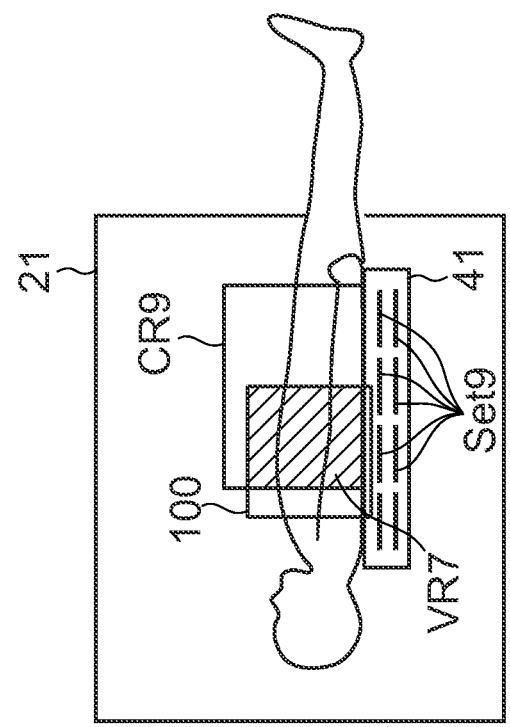
FIGS. 16A and 16B are diagrams respectively showing overlap regions VR9 and VRn between the sensitive regions CR9 and CRn for the combinations Set9 and Setn and the scan region 100.
Figure 16B:
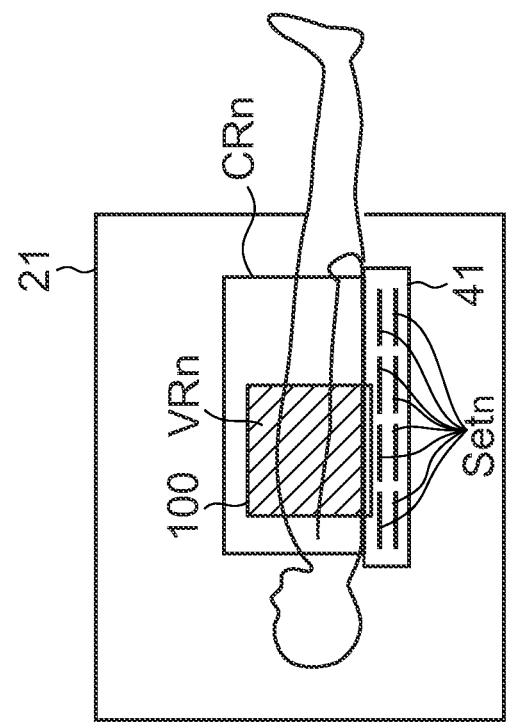

The volumes Vover of the overlap regions VR1 through VRn are represented by characters of v1 through vn for convenience of explanation. Incidentally, since no overlap region exists in the case of the sensitive region CR4 and the scan region 100 as shown in FIG. 13B, the volume Vover of the overlap region=0.

After the volume of each overlap region has been determined, the processing flow proceeds to Substep S42.

At Substep S42, a scan volume rate Cscan and a sensitivity volume rate Csense are calculated based on the volumes Vover of the overlap regions VR1 through VRn calculated at Substep S41. The scan volume rate Cscan and the sensitivity volume rate Csense will be explained below in order.

(1) Concerning the Scan Volume Rate Cscan:

The scan volume rate Cscan is of an index indicative of a proportion of the overlap region to its corresponding scan region. In the present embodiment, the scan volume rate Cscan is expressed in the following equation:

$$Cscan = (Vover/Vscan) \times 100 (\%) \quad (1)$$

where Vover represents respective volumes of overlap regions

VR1 through VRn, and

Vscan is a volume of scan region 100.

Accordingly, it means that as the scan volume rate Cscan increases, the proportion of overlap of the scan region 100 on each sensitive region becomes larger. On the other hand, it means that as the scan volume rate Cscan decreases, the proportion of overlap of the scan region 100 on each sensitive region becomes smaller. Vover of the equation (1) has been calculated at Substep S41. Vscan can also be calculated based on the scan region 100. Accordingly, the scan volume rate Cscan can be calculated by substituting the value of Vover and the value of Vscan into the equation (1).

A scan volume rate Cscan at the combination of the scan region 100 and each of other sensitive regions can also be calculated similarly.

(2) Concerning Sensitivity Volume Rate Csense:

The sensitivity volume rate Csense is of an index indicative of a proportion of the overlap region to its corresponding sensitive region. In the present embodiment, the sensitivity volume rate Csense is expressed in the following equation:

$$Csense = (Vover/Vsense) \times 100 (\%) \quad (2)$$

where Vover represents respective volumes of overlap regions

VR1 through VRn, and

Vsense represents respective volumes of sensitive regions CR1 through CRn.

Accordingly, it means that as the sensitivity volume rate Csense increases, the proportion of coincidence (compatibility) of the sensitive region with the overlap region becomes larger. It means that as the sensitivity volume rate Csense decreases, the proportion of coincidence (compatibility) of the sensitive region with the overlap region becomes smaller. Vover of the equation (2) has been calculated at Substep S41. Vsense has been stored in the database 9. Accordingly, the sensitivity volume rate Csense can be calculated by substituting the value of Vover and the value of Vsense into the equation (2). A sensitivity volume rate Csense at the combination of the scan region 100 and each of other sensitive regions can also be calculated in like manner.

The scan volume rate Cscan and the sensitivity volume rate Csense are calculated as described above. One example illustrative of the values of the scan volume rate Cscan and the sensitivity volume rate Csense is shown in FIG. 18 for each of the combinations of the scan region 100 and the sensitive regions CR1 through CRn.

After the calculation of the scan volume rate Cscan and the sensitivity volume rate Csense, the processing flow proceeds to Substep S43.

At Substep S43, the corresponding combination of coil elements used to receive magnetic resonance signals in the scan region 100 is selected out of the combinations Set1 through Setn (refer to FIGS. 12 through 16), based on the value of the scan volume rate Cscan.

As mentioned above, the larger the value of the scan volume rate Cscan, the greater the proportion of each overlap region to the scan region 100. Thus, at Substep S43, each combination of coil elements, having the sensitive region at the time that the scan volume rate Cscan becomes a maximum value, is selected as the combination of the coil elements used to receive the magnetic resonance signals in the scan region 100. Here, the maximum value of the scan volume rate Cscan is assumed to be 90(%). The two sensitive regions CR8 and CRn are respectively assumed to exist as the sensitive region at the time that Cscan=90(%) (refer to FIG. 18). Accordingly, the following two combinations of coil elements are selected at Substep S43.

(1) Combination Set8 of coil elements having sensitive region CR8

(2) Combination Setn of coil elements having sensitive region CRn

After the selection of the combinations Set8 and Setn, the processing flow proceeds to Substep S44.

It is determined at Substep S44 whether the combinations of the coil elements selected at Substep S43 are selected in plural form. When only one combination of coil elements is selected, the processing flow proceeds to Step S5, where a scan is executed using the selected combination of coil elements and the processing flow is ended. On the other hand, when the plural combinations of coil elements are selected, the processing flow proceeds to Substep S45. Since the two combinations of coil elements have been selected in the present embodiment (Set8 and Setn), the processing flow proceeds to Substep S45.

At Substep S45, the corresponding combination of coil elements used to receive the magnetic resonance signals in the scan region 100 is selected out of the combinations Set8 and Setn each selected at Substep S43, based on the value of the sensitivity volume rate Csense. At Substep S45, the corresponding combination of coil elements, having the sensitive region largest in the sensitivity volume rate Csense is selected out of the combinations Set8 and Setn. As shown in FIG. 18, the sensitive regions CR8 and CRn for the combinations Set8 and Setn are 90(%) in scan volume rate Cscan, but 60(%) and 40(%) in sensitivity volume rate Csense. Namely, the sensitive region CR8 for the combination Set8 is larger than the sensitive region CRn for the combination Setn in sensitivity volume rate Csense. Accordingly, the combination Set8 (Cscan=90(%) and Csense=60(%)) large in sensitivity volume rate Csense is selected out of the combinations Set8 and Setn. After the selection of the combination Set8 of the coil elements, the processing flow proceeds to Step S5, where a scan is performed using the selected combination Set8 of coil elements, and the processing flow is ended.

In the present embodiment, the corresponding combination of coil elements used to receive the magnetic resonance signals is selected out of the combinations Set1 through Setn, based on the scan volume rate Cscan and the sensitivity volume rate Csense. It is thus possible to easily select the combination of the coil elements suitable for the scanning of the scan region 100.

Incidentally, the scan region 100 and the coil sensitive regions may respectively be defined as one region such as a rectangular parallelepiped, a polyhedron, a sphere or the like. Alternatively, they may respectively be defined as combinations of plural regions different in shape.

In the present embodiment, the scan volume rate Cscan and the sensitivity volume rate Csense have respectively been defined in the equations (1) and (2). They may, however, be defined in other equations.

In the present embodiment, the scan volume rate Cscan and the sensitivity volume rate Csense are calculated with respect to each of the n combinations of coil elements. The scan volume rate Cscan and the sensitivity volume rate Csense may, however, be calculated only with respect to some of the n combinations of coil elements as needed.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus comprising:
   a plurality of coil elements configured to receive magnetic resonance signals of a subject in a plurality of selectable combinations;
   a sensitive region storage device configured to store a sensitive region for each of the plurality of combinations of coil elements;
   a setting device configured to set a plurality of scan regions;
   a calculation device configured to:
      calculate a scan volume rate indicating proportions of overlap regions between the scan regions and the sensitive regions to the scan regions, and a sensitivity volume rate indicating proportions of the overlap regions to the sensitive regions; and
      calculate a volume of each of the overlap regions and the scan volume rate and the sensitivity volume rate, based on the volumes of the overlap regions; and
   a selection device configured to select at least one of the plurality of combinations of coil elements based on the scan volume rate and the sensitivity volume rate.

2. The magnetic resonance imaging apparatus according to claim 1, wherein said selection device is configured to select a first combination of coil elements from the plurality of combinations of coil elements, based on the scan volume rate, and when the first combination includes a plurality of first combinations of coil elements, said selection device is configured to select multiple first combinations of coil elements based on the sensitivity volume rate.

3. The magnetic resonance imaging apparatus according to claim 2, wherein said calculation device is configured to calculate a volume of each of the overlap regions and the scan volume rate and the sensitivity volume rate, based on the volumes of the overlap regions.

4. The magnetic resonance imaging apparatus according to claim 3, wherein the scan volume rate indicates a ratio between the volume of the overlap region and the scan region, and wherein the sensitivity volume rate indicates a ratio between the volume of the overlap region and the sensitive region.

5. The magnetic resonance imaging apparatus according to claim 2, wherein said sensitive region storage device is configured to store positions and volumes of the sensitive regions for the plurality of combinations of coil elements.

6. The magnetic resonance imaging apparatus according to claim 1, wherein the scan volume rate indicates a ratio between the volume of the overlap region and the scan region, and wherein the sensitivity volume rate indicates a ratio between the volume of the overlap region and the sensitive region.

7. The magnetic resonance imaging apparatus according to claim 6, wherein said sensitive region storage device is configured to store positions and volumes of the sensitive regions for the plurality of combinations of coil elements.

8. The magnetic resonance imaging apparatus according to claim 1, wherein said sensitive region storage device is configured to store positions and volumes of the sensitive regions for the plurality of combinations of coil elements.

9. The magnetic resonance imaging apparatus according to claim 1, wherein said sensitive region storage device is configured to store positions and volumes of the sensitive regions for the plurality of combinations of coil elements.

10. A method of selecting combinations of a plurality of coil elements for receiving magnetic resonance signals of a subject, said method comprising:
    preparing a plurality of combinations of the plurality of coil elements;
    storing respective sensitive regions for each of the plurality of combinations of coil elements;
    setting scan regions;
    calculating a scan volume rate indicating proportions of overlap regions between the scan regions and the sensitive regions to the scan regions, and a sensitivity volume rate indicating proportions of the overlap regions to the sensitive regions; and
    selecting at least one of the plurality of combinations of coil elements based on the scan volume rate and the sensitivity volume rate.

11. The method according to claim 10, wherein selecting at least one of the plurality of combinations of coil elements comprises selecting a first combination of coil elements based on the scan volume rate, and when the first combination includes a plurality of first combinations of coil elements, said selecting at least one of the plurality of combinations of coil elements comprises selecting multiple first combinations of coil elements based on the sensitivity volume rate.

12. The method according to claim 10, further comprising calculating a volume of each of the overlap regions and calculating the scan volume rate and the sensitivity volume rate based on the volumes of the overlap regions.

13. The method according to claim 12, wherein the scan volume rate indicates a ratio between the volumes of the overlap regions and the scan regions, and wherein the sensitivity volume rate indicates a ratio between the volumes of the overlap regions and the sensitive regions.

14. The method according to claim 10, further comprising storing positioned and volumes of the sensitive regions for the plurality of combinations of coil elements.

15. A magnetic resonance imaging apparatus comprising:
a plurality of coil elements configured to receive magnetic resonance signals of a subject in a plurality of selectable combinations;
a database; and
a central processing unit coupled to said plurality of coil elements, said central processing unit configured to:
store in said database a sensitive region for each of the plurality of combinations of coil elements;
set a plurality of scan regions;
calculate a scan volume rate indicating proportions of overlap regions between the scan regions and the sensitive regions to the scan regions, and a sensitivity volume rate indicating proportions of the overlap regions to the sensitive regions; and
a selection device configured to select at least one of the plurality of combinations of coil elements based on the scan volume rate and the sensitivity volume rate.

16. The magnetic resonance imaging apparatus according to claim 15, wherein said central processing unit is configured to select a first combination of coil elements from the plurality of combinations of coil elements, based on the scan volume rate, and when the first combination includes a plurality of first combinations of coil elements, said central processing unit is configured to select multiple first combinations of coil elements based on the sensitivity volume rate.

17. The magnetic resonance imaging apparatus according to claim 15, wherein said central processing unit is configured to calculate a volume of each of the overlap regions and the scan volume rate and the sensitivity volume rate, based on the volumes of the overlap regions.

18. The magnetic resonance imaging apparatus according to claim 17, wherein the scan volume rate indicates a ratio between the volume of the overlap region and the scan region, and wherein the sensitivity volume rate indicates a ratio between the volume of the overlap region and the sensitive region.

19. The magnetic resonance imaging apparatus according to claim 15, wherein said database is configured to store positions and volumes of the sensitive regions for the plurality of combinations of coil elements.

* * * * *